US011640999B2

(12) United States Patent
Maynard et al.

(10) Patent No.: US 11,640,999 B2
(45) Date of Patent: May 2, 2023

(54) THERMOELECTRIC COOLER INCLUDING A SINGLE, SOLID, AND ELECTRICALLY INSULATIVE SUPPORT/PLATE HAVING A PLANAR SIDE DIRECTLY AFFIXED TO UPPER ELECTRICAL CONNECTIONS AND NON-PLANAR SIDE TO A RAISED STRUCTURE

(71) Applicant: Moxtek, Inc., Orem, UT (US)

(72) Inventors: Jason Maynard, Orem, UT (US); Shawn S. Chin, Elk Ridge, UT (US); Jonathan Barron, Lehi, UT (US); David S. Hoffman, Draper, UT (US)

(73) Assignee: Moxtek, Inc., Orem, UT (US)

( * ) Notice: Subject to any disclaimer, the term of this patent is extended or adjusted under 35 U.S.C. 154(b) by 0 days.

(21) Appl. No.: 17/843,238

(22) Filed: Jun. 17, 2022

(65) Prior Publication Data
US 2022/0320353 A1    Oct. 6, 2022

Related U.S. Application Data

(63) Continuation of application No. 16/562,785, filed on Sep. 6, 2019, now Pat. No. 11,398,573.

(60) Provisional application No. 62/805,653, filed on Feb. 14, 2019, provisional application No. 62/744,398, filed on Oct. 11, 2018, provisional application No. 62/743,136, filed on Oct. 9, 2018, provisional application No. 62/739,622, filed on Oct. 1, 2018.

(51) Int. Cl.
| | |
|---|---|
| *H01L 31/024* | (2014.01) |
| *G01T 1/24* | (2006.01) |
| *H01L 31/115* | (2006.01) |
| *H01L 31/02* | (2006.01) |

(52) U.S. Cl.
CPC ............ *H01L 31/024* (2013.01); *G01T 1/244* (2013.01); *H01L 31/02002* (2013.01); *H01L 31/115* (2013.01); *H10N 10/17* (2023.02)

(58) Field of Classification Search
CPC ............. H01L 31/024; H01L 31/02002; H01L 31/115; H01L 35/32; G01T 1/244
See application file for complete search history.

(56) References Cited

U.S. PATENT DOCUMENTS

| | | | |
|---|---|---|---|
| 6,222,113 B1 * | 4/2001 | Ghoshal | H01L 35/32 |
| | | | 62/3.61 |
| 8,199,882 B2 | 6/2012 | Decker | |

FOREIGN PATENT DOCUMENTS

| | | | | |
|---|---|---|---|---|
| EP | 0543121 A2 * | 5/1993 | ............ | H01J 37/244 |
| WO | WO-2009150080 A1 * | 12/2009 | ......... | H01L 21/4867 |

* cited by examiner

*Primary Examiner* — Ermias T Woldegeorgis
(74) *Attorney, Agent, or Firm* — Thorpe North & Western, LLP

(57) ABSTRACT

An x-ray detector can be small and have efficient cooling. In one embodiment, the x-ray detector can comprise a thermoelectric cooler (TEC) with upper electrical connections, a support, a cap, and a silicon drift detector (SDD). A planar side of the support can be directly affixed to upper electrical connections of the TEC. The support can have a non-planar side, opposite of the planar side, with a raised structure. A bottom face of the cap can be affixed to the raised structure, forming a cavity between the cap and the non-planar side of the support. The SDD can be affixed to a top face of the cap. In another embodiment, the non-planar side of the support can face the TEC. In another embodiment, a PIN photodiode can be directly affixed to a plate and the plate directly affixed to upper electrical connections of the TEC.

20 Claims, 8 Drawing Sheets

THERMOELECTRIC COOLER INCLUDING A SINGLE, SOLID, AND ELECTRICALLY INSULATIVE SUPPORT/PLATE HAVING A PLANAR SIDE DIRECTLY AFFIXED TO UPPER ELECTRICAL CONNECTIONS AND NON-PLANAR SIDE TO A RAISED STRUCTURE

PRIORITY CLAIM(S)

This application is a continuation of U.S. patent application Ser. No. 16/562,785, filed on Sep. 6, 2019; which claims priority to U.S. Provisional Patent Application No. 62/739,622, filed Oct. 1, 2018; 62/743,136, filed Oct. 9, 2018; 62/744,398, filed Oct. 11, 2018; and 62/805,653, filed Feb. 14, 2019; which are incorporated herein by reference.

FIELD OF THE INVENTION

The present application is related generally to x-ray detectors.

BACKGROUND

X-ray detectors sometimes need to be inserted into small locations. Small size is useful.

For high resolution, x-ray detectors are cooled to low temperatures, such as around −20° C. for example. For more efficient cooling, it is helpful to minimize thermal resistance.

Electromagnetic interference can disrupt optimal operation of x-ray detection devices, such as for example PIN photodiodes or silicon drift detectors (SDD).

For material analysis, x-rays are directed towards to a sample. The sample then reemits x-rays which are characteristic of the chemical composition of the sample. Surrounding materials, including materials of the x-ray detector, can emit x-rays which can interfere with x-ray signal from the sample. It can be beneficial to block x-rays from these surrounding materials from hitting the x-ray detection device.

BRIEF DESCRIPTION OF THE DRAWINGS (DRAWINGS MIGHT NOT BE DRAWN TO SCALE)

Figure 1:
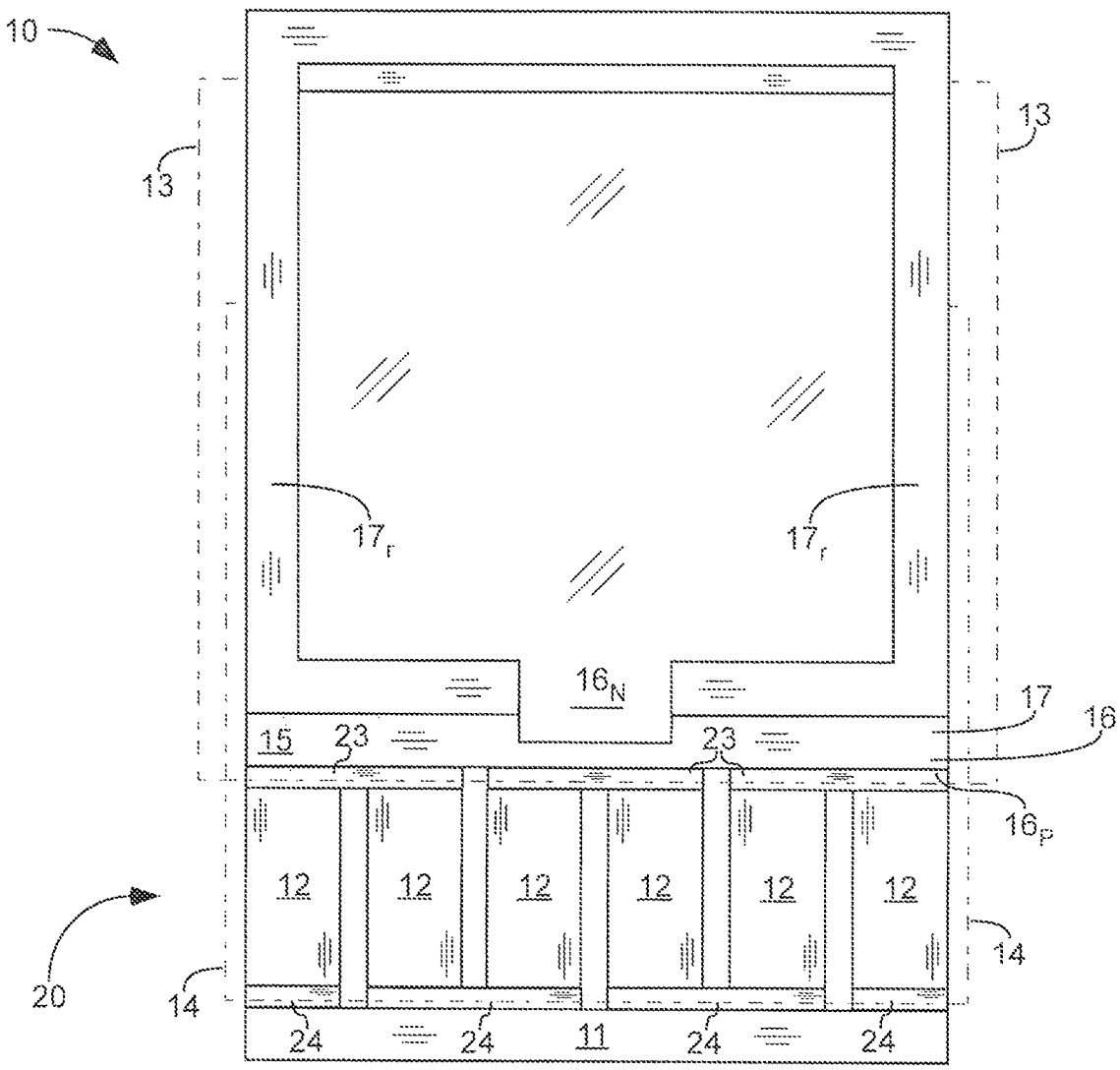

FIG. 1 is a schematic perspective-view of a cooler 10 for an x-ray detector, comprising a thermoelectric cooler (TEC) 20 with pillars 12 electrically coupled to upper electrical connections 23 and lower electrical connections 24, a support 15 including a base 16 with a planar side $16_P$ and a non-planar side $16_N$ opposite of the planar side $16_P$, the planar side $16_P$ directly affixed to the upper electrical connections 23, and a raised structure 17 on the non-planar side $16_N$ extending away from the base 16, in accordance with an embodiment of the present invention.

Figure 2:
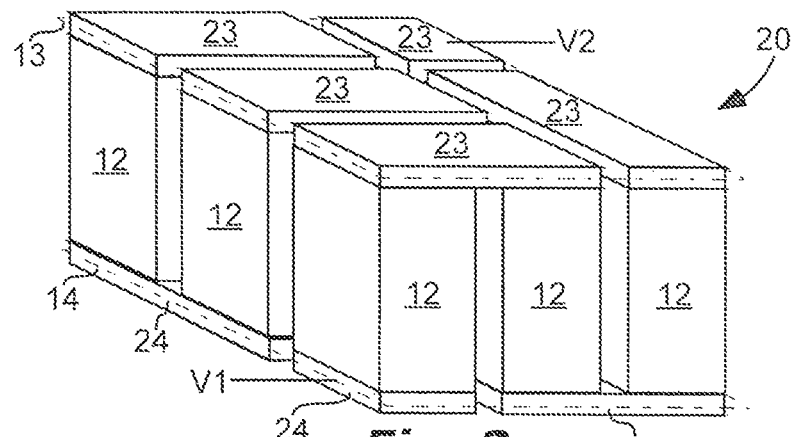

FIG. 2 is a schematic perspective-view of a TEC 20, comprising pillars 12 electrically coupled in series and extending between upper electrical connections 23 in a top plane 13 and lower electrical connections 24 in a bottom plane 14, in accordance with an embodiment of the present invention.

Figure 3:
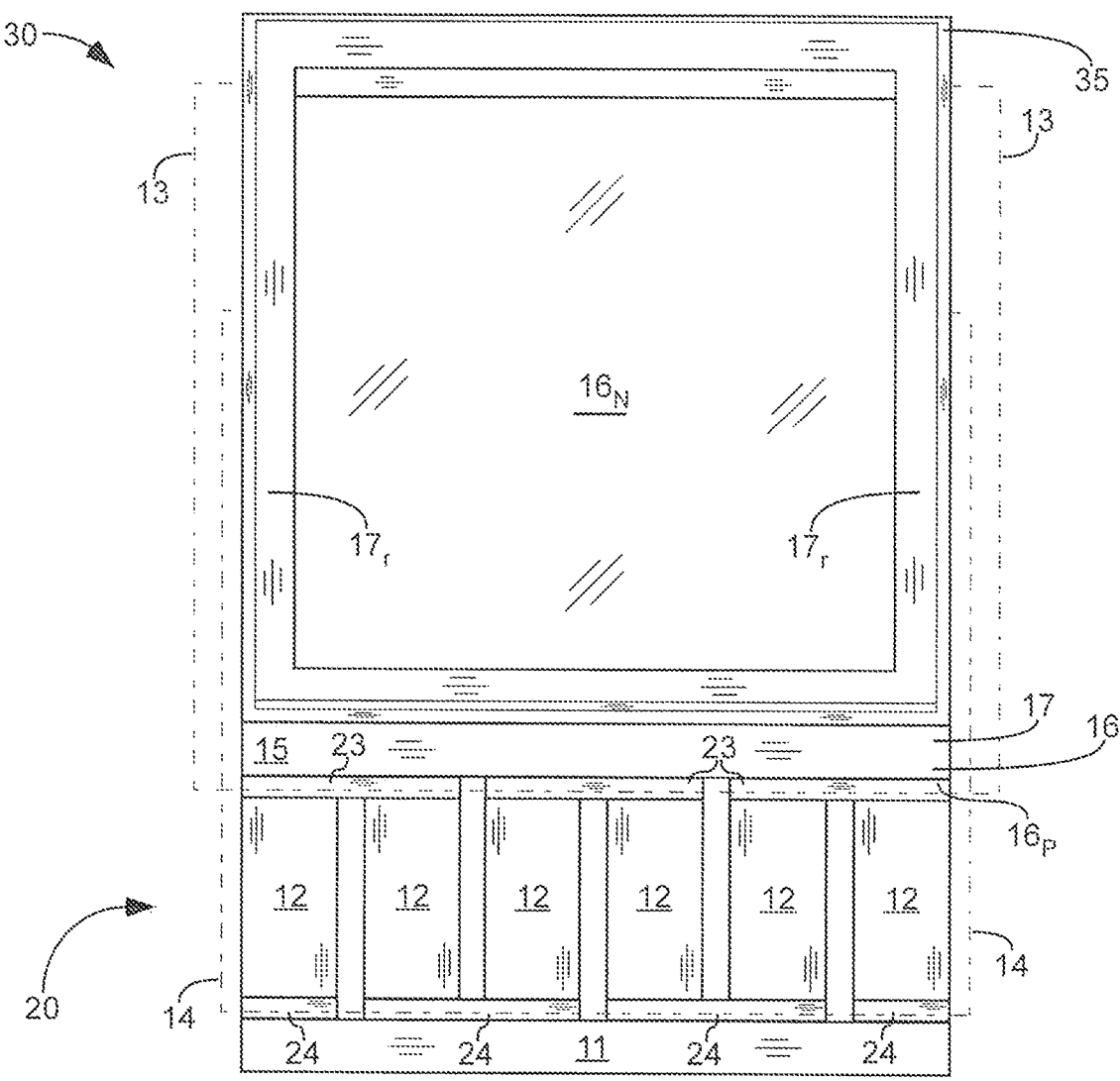

FIG. 3 is a schematic perspective-view of a cooler 30 for an x-ray detector, similar to cooler 10, further comprising the raised structure 17 including a rib $17_r$ extending around the perimeter of the support 15, in accordance with an embodiment of the present invention.

Figure 4:
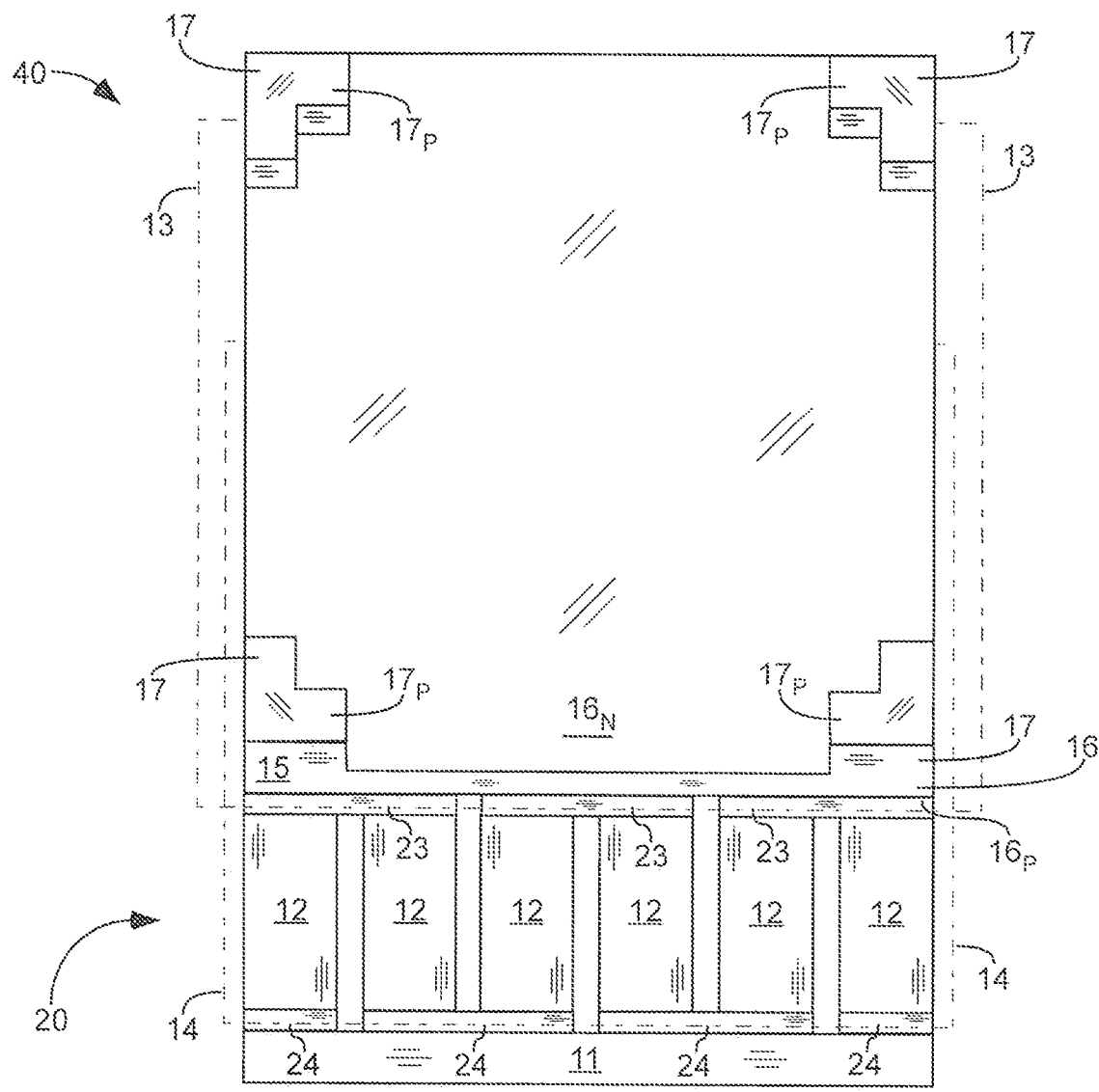

FIG. 4 is a schematic perspective-view of a cooler 40 for an x-ray detector, similar to cooler 10, further comprising the raised structure 17 includes four separate posts $17_P$ with a post $17_P$ at each of four corners of the support 15, in accordance with an embodiment of the present invention.

Figure 5:
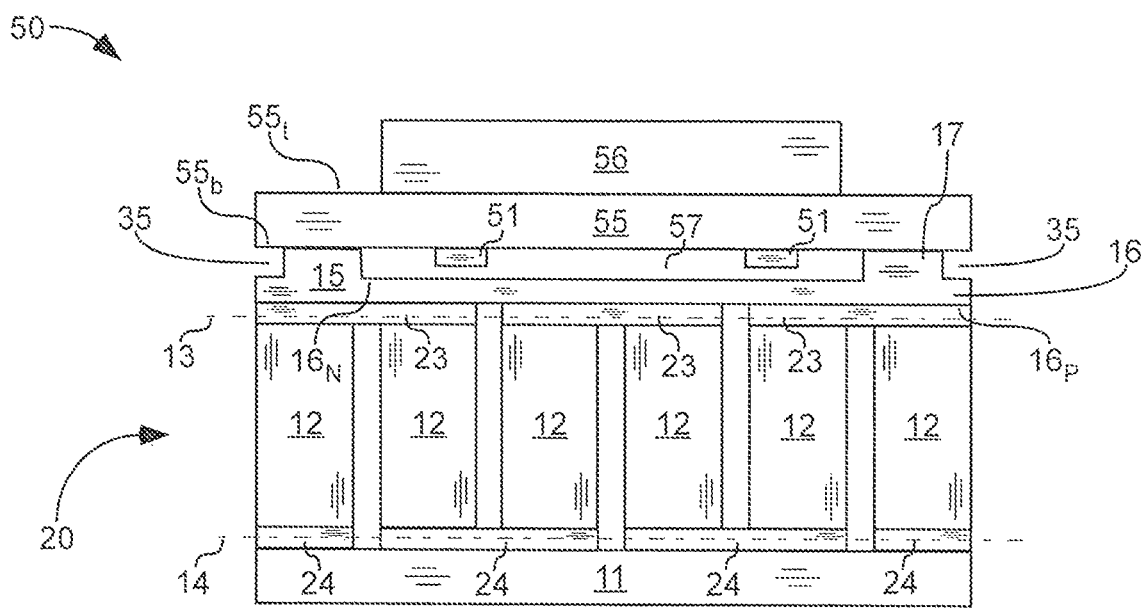

FIG. 5 is a schematic side-view of an x-ray detector 50, including cooler 10, 30, or 40, further comprising a cap 55 affixed to the raised structure 17 of the support 15, forming a cavity 57 between the cap 55 and the non-planar side $16_N$ of the support 15, and a silicon drift detector (SDD) 56 affixed to the cap 55, in accordance with an embodiment of the present invention.

Figure 6:
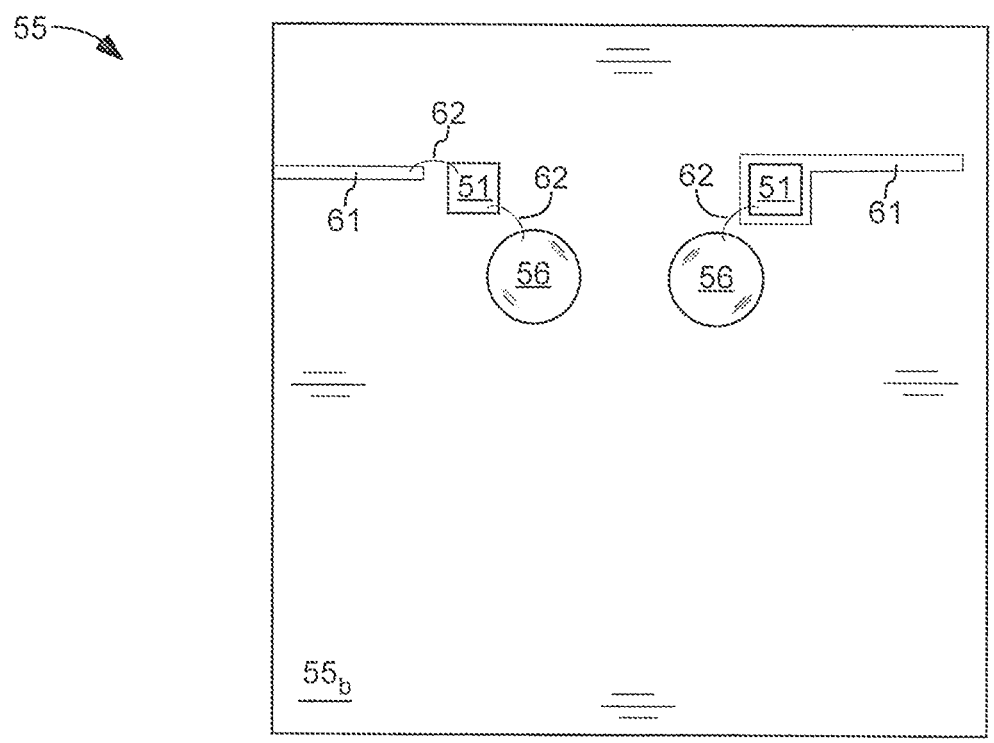

FIG. 6 is a schematic view of a bottom face $55_b$ of the cap 55, electronic components 51 carried by the bottom face $55_b$ of the cap 55, wire bonds 62 electrically connecting the electronic components 51 to traces 61, and wire bonds 62 electrically connecting the electronic components 51 to the SDD 56 through holes extending through the cap 55, in accordance with an embodiment of the present invention.

Figure 7:
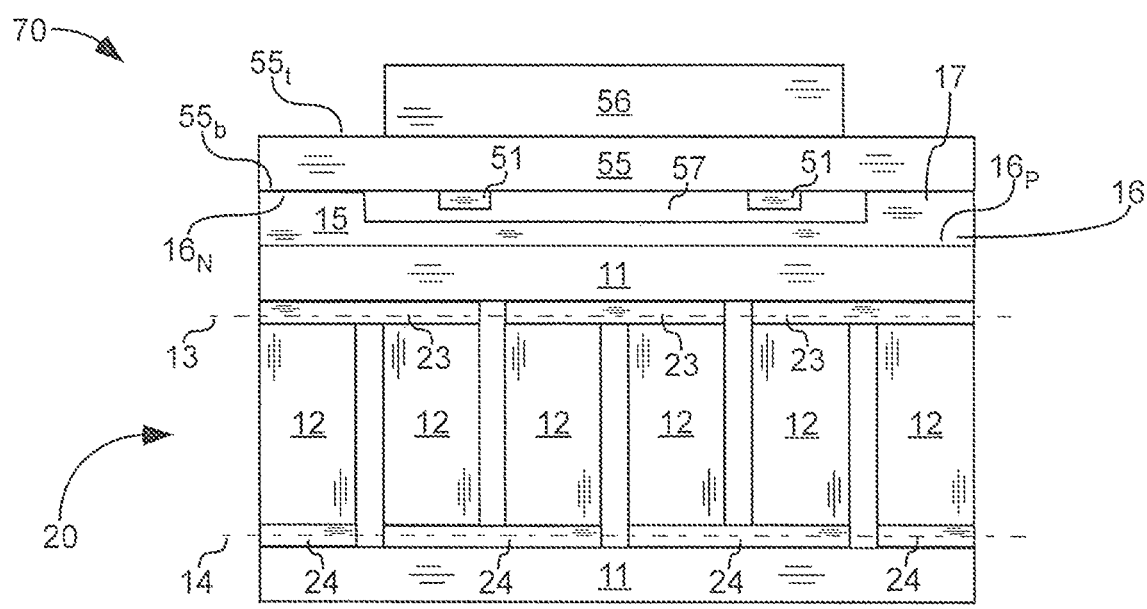

FIG. 7 is a schematic side-view of an x-ray detector 70, comprising a TEC 20 sandwiched between a pair of electrically insulating materials 11, a support 15, which can be metallic, shaped as described above and carried by the TEC 20, a cap 55 as described above carried by the support 15, and an SDD affixed to cap 55, in accordance with an embodiment of the present invention.

Figure 8:
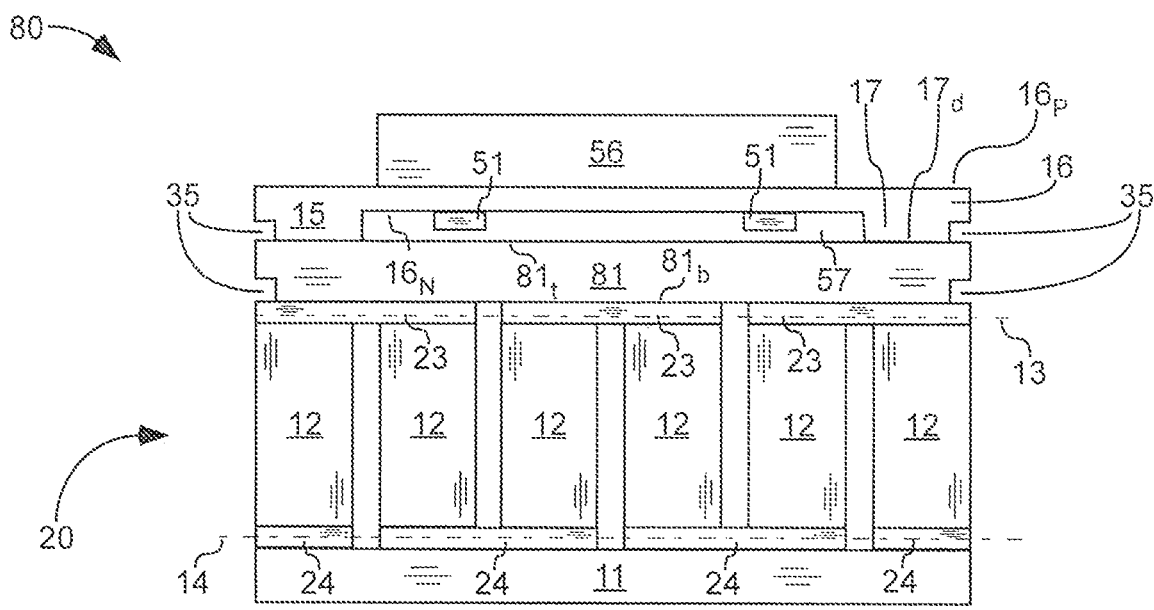

FIG. 8 is a schematic side-view of an x-ray detector 80, comprising a TEC 20, a plate 81, a support 15, and an SDD 56; a bottom side $81_b$ of the plate 81 affixed to upper electrical connections 23 of the TEC 20; a distal end $17_d$ of a raised structure 17 of the support 15 affixed to the plate 81, forming a cavity 57 between the plate 81 and the support 15; and a planar side $16_P$ of the support 15 affixed to the SDD 56; in accordance with an embodiment of the present invention.

Figure 9:
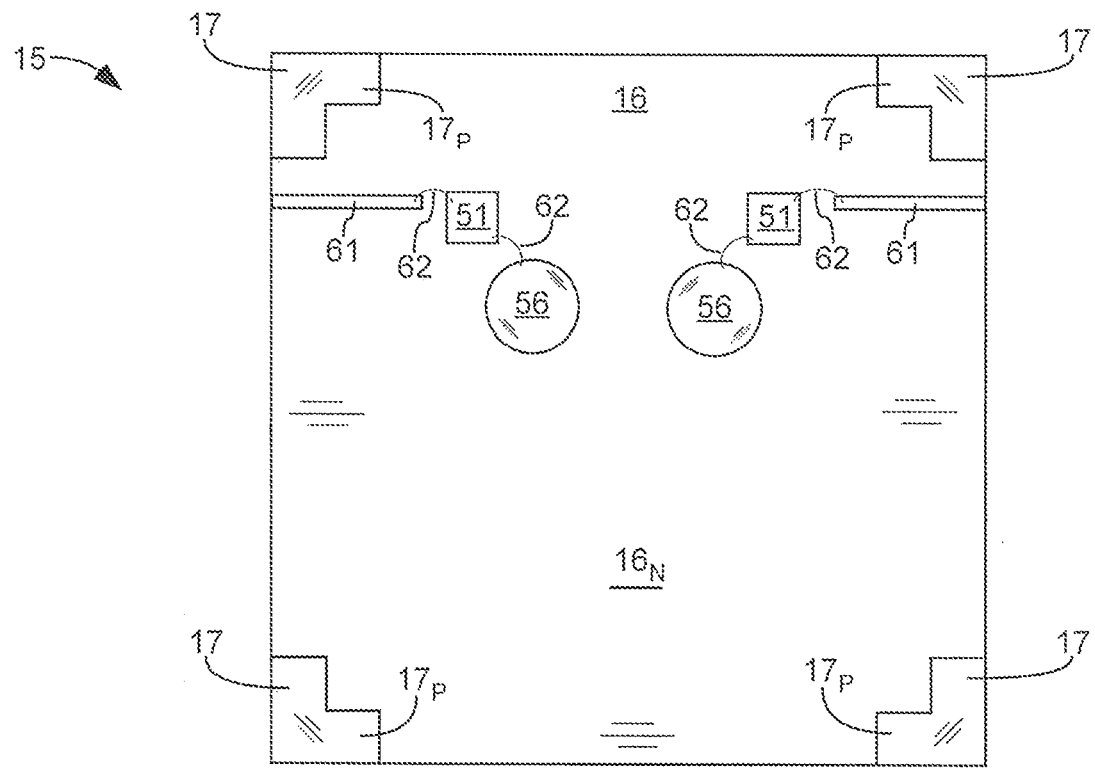

FIG. 9 is a schematic view of one embodiment of the non-planar side $16_N$ of the support 15 of FIG. 8, electronic components 51 carried by the non-planar side $16_N$ of the support 15, wire bonds 62 electrically connecting the electronic components 51 to traces 61 and to the SDD 56 through holes extending through the support 15, and the raised structure 17 of the support 15 including four separate posts $17_P$ with a post $17_P$ at each of four corners of the support 15, in accordance with an embodiment of the present invention.

Figure 10:
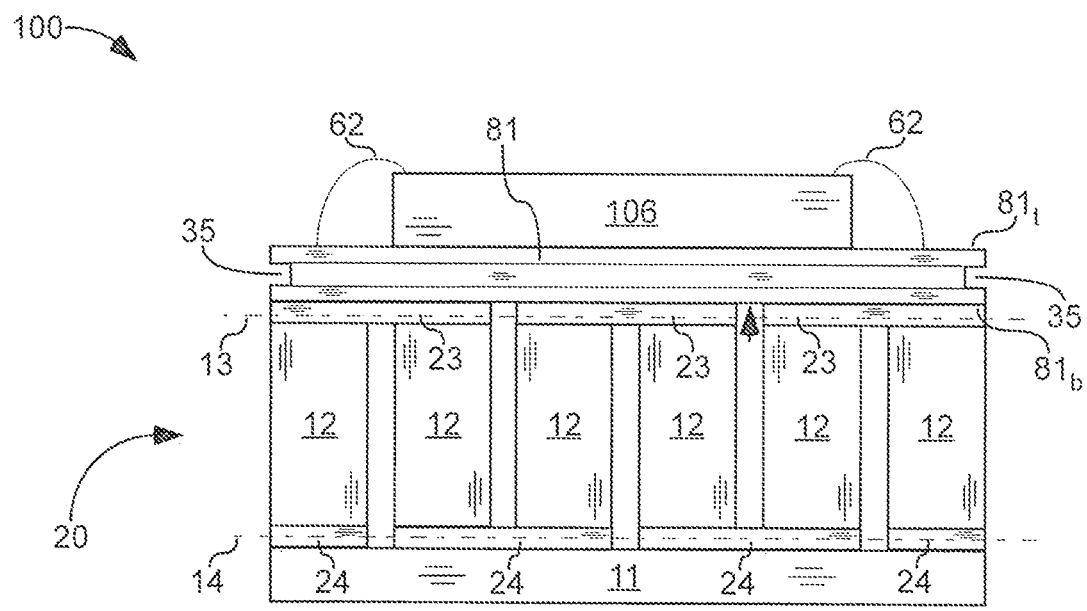

FIG. 10 is a schematic side-view of an x-ray detector 100, comprising a TEC 20, a plate 81, and a PIN photodiode 106, with a sequence of the TEC 20, the plate 81, then the PIN photodiode 106; the plate 81 having a bottom side $81_b$ directly affixed to upper electrical connections 23 of the TEC 20; and the PIN photodiode 106 directly affixed to a top side $81_t$ of the plate 81; in accordance with an embodiment of the present invention.

Figure 11:
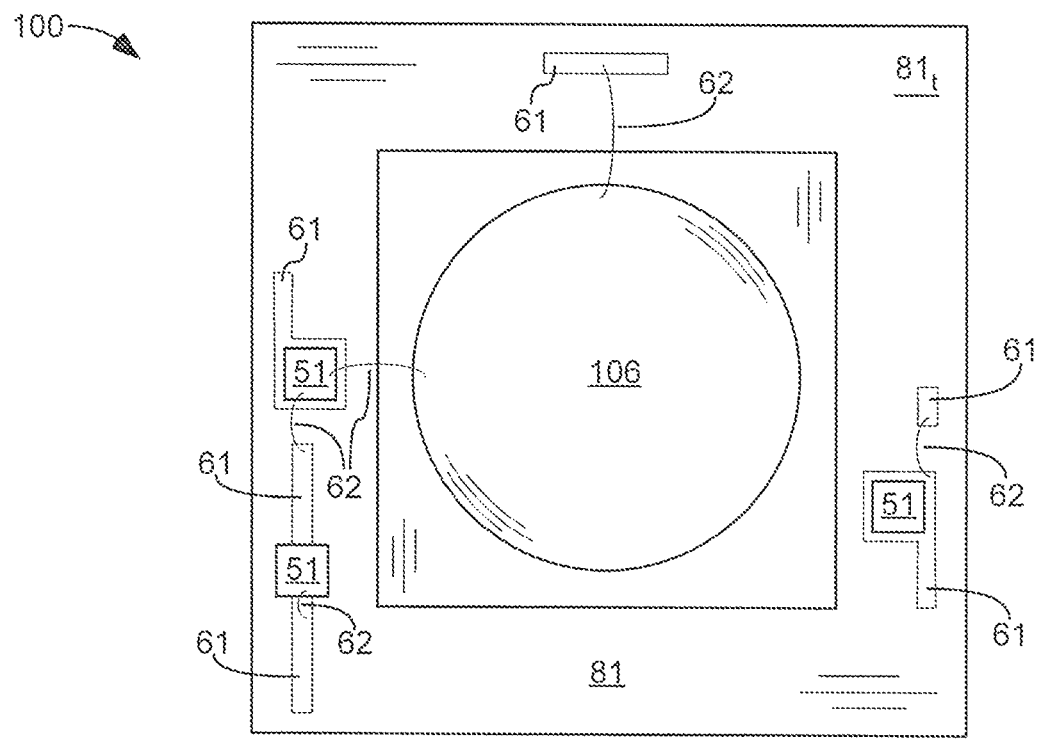

FIG. 11 is a schematic top-view of x-ray detector 100, in accordance with an embodiment of the present invention.

Figure 12:
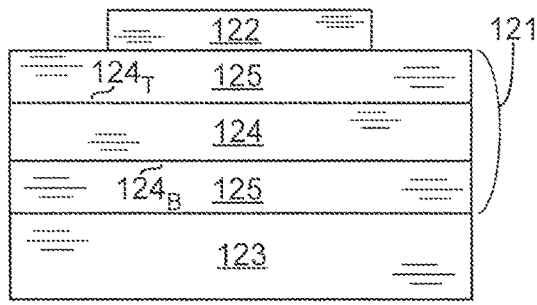

FIG. 12 is a schematic side-view of an x-ray detector 120, comprising a blocking ceramic 121 sandwiched between an x-ray detection device 122 and a cooling mechanism 123, the blocking ceramic 121 including a metal blocking layer 124 sandwiched between a pair of ceramic layers 125, in accordance with an embodiment of the present invention.

Figure 13:
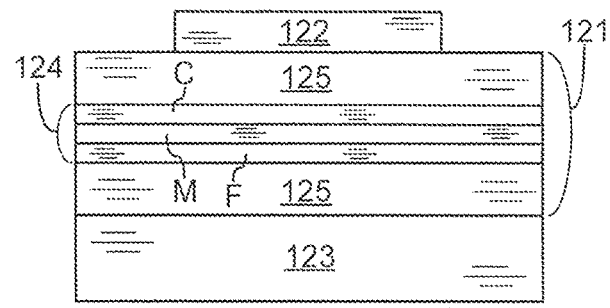

FIG. 13 is a schematic side-view of an x-ray detector 130, similar to x-ray detector 120, further comprising the metal blocking layer 124 including three layers of different metals C, M, and F, in accordance with an embodiment of the present invention.

Figure 14:
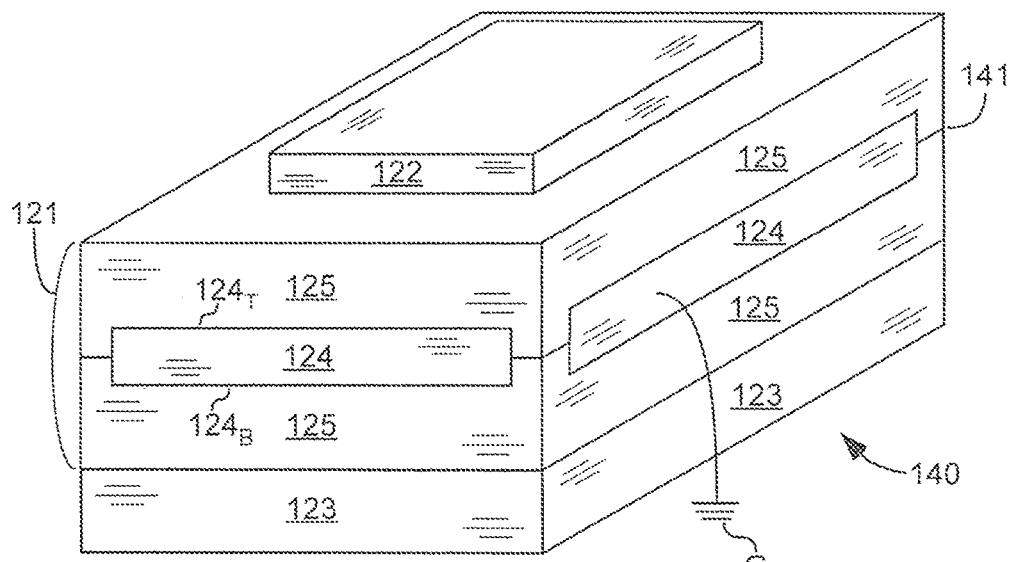

FIG. 14 is a schematic perspective view of an x-ray detector 140, similar to x-ray detectors 120 and 130, further comprising the pair of ceramic layers 125 adjoin each other at four outer corners, in accordance with an embodiment of the present invention.

Figure 15:
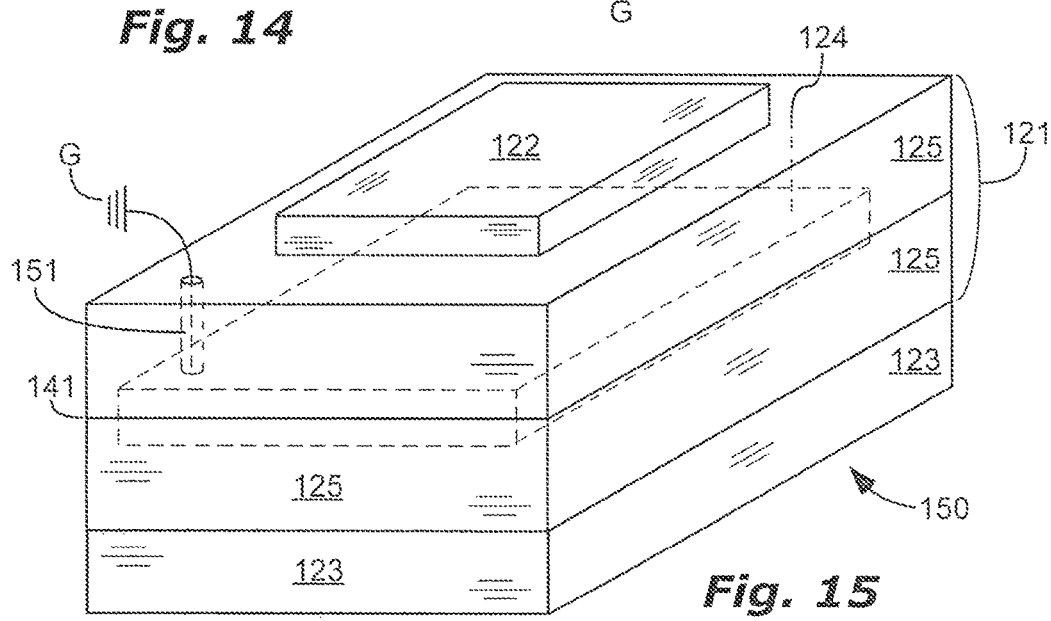

FIG. 15 is a schematic perspective view of an x-ray detector 150, similar to x-ray detectors 120, 130, and 140, further comprising one of or both of the pair of ceramic layers 125 including a cup facing the metal blocking layer 124, the metal blocking layer 124 is located in the cup, the pair of ceramic layers adjoin each other in a co-fired bond at an entire outer perimeter of each of the pair of ceramic layers, and a ground connection G to the metal blocking layer 124 extends through a hole 151 in the blocking ceramic 121 from a side of the blocking ceramic 121 on which the x-ray detection device 122 is located, in accordance with an embodiment of the present invention.

DEFINITIONS

As used herein, the term "adjoin" means direct and immediate contact.

As used herein, the phrase "directly affixed" means the objects affixed have, at most, an adhesive, solder, or both between them, but no other structural components.

As used herein, the term "μm" means micrometer(s).

As used herein, the terms "trace" and "traces" mean electrically conductive layers, typically metals such as copper or gold, such as on a circuit board for conducting electricity between electronic components.

The terms "top" and "bottom" are used herein as relative terms relative to the orientation of the Figures.

DETAILED DESCRIPTION

First SDD Embodiment

As illustrated in FIG. 1, a cooler 10 for an x-ray detector is shown comprising a thermoelectric cooler (TEC) 20 comprising electrical components for thermoelectric cooling, including pillars 12 extending between upper electrical connections 23 in a top region and lower electrical connections 24 in a bottom region, and interconnected by the electrical connections 23 and 24. The pillars 12, the upper electrical connections 23, the lower electrical connections 24, or combinations thereof can be electrically conductive. The upper electrical connections 23 in the top region can be located in a top plane 13. The lower electrical connections 24 in the bottom region can be located in a bottom plane 14.

The pillars 12 can be electrically coupled to the upper electrical connections 23 and to the lower electrical connections 24. Example maximum resistance between each pillar 12 and each electrical connection (each upper electrical connection 23 and each lower electrical connection 24) include $\leq 10^{-2}$ ohms, $\leq 10^{-3}$ ohms, $\leq 10^{-4}$ ohms, $\leq 10^{-5}$ ohms, or $\leq 10^{-6}$ ohms. The pillars 12 can be electrically coupled in series, and electrically coupled to each other through the upper electrical connections 23 and the lower electrical connections 24. Electrical connections between adjacent pillars 12 can alternate between the top region and the bottom region. Alternating pillars 12 can be made of a different material with respect to each other. For example, the pillars 12 can alternate between p-doped and n-doped semiconductors.

The TEC 20 can be sandwiched between an electrically insulating material 11 and a support 15. The support 15 can be electrically insulative. The electrically insulating material 11, the support 15, or both can be ceramic. The TEC 20 is illustrated in FIG. 2 without the electrically insulating material 11 and the support 15 in order to show more clearly components of the TEC 20.

The support 15, can be a single, solid, electrically insulating material. Thus, the support 15 can be free of adhesive-filled interface joints. This is in contrast to multiple ceramics bonded together which can have increased resistance to heat transfer at interfaces between the ceramics. The support 15 can include a base 16 with a planar side $16_P$ and a non-planar side $16_N$ opposite of the planar side $16_P$.

The upper electrical connections 23 can be formed on the planar side $16_P$ of the support 15 by depositing a thin metal film then patterning traces needed for attachment to the pillars 12, and for electrical current flow between adjacent pillars 12. The upper electrical connections 23 and the support 15 can be attached to the pillars 12 by solder or other suitable means.

A raised structure 17 on the non-planar side $16_N$ can extend away from the base 16. A purpose of the raised structure 17 is to provide a cavity 57 as described below. The raised structure 17 can have various shapes. It can be beneficial for the raised structure 17 to be long with a large surface area for contact with the cap 55 described below, to allow increased heat transfer between the raised structure 17 and the cap 55. It can also be useful, however, for the raised structure 17 to have openings or gaps to allow improved evacuation of the cavity 57 during sealing of the detector. The design of the raised structure 17 for each application can be based on a balance of these competing interests.

For example, the raised structure 17 can be a rib $17_r$ extending around some or all of a perimeter of the support 15. The raised structure 17 of cooler 10 in FIG. 1 extends partially around the perimeter of the support 15. The raised structure 17 of cooler 30 of FIG. 3 extends all of the way around the perimeter of the support 15. Thus, cooler 10 likely will have inferior heat transfer than cooler 30 between the raised structure 17 and the cap 55, but it can be easier to evacuate a detector with cooler 10. Holes can be drilled into cooler 30 in order to allow evacuation. Examples of the extension of the rib $17_r$ around the perimeter of the support 15 include: $\geq 25\%$, $\geq 50\%$, $\geq 75\%$, or $\geq 90\%$; and $\leq 75\%$, $\leq 90\%$, $\leq 95\%$, or $\leq 99\%$ of a perimeter of the support 15.

As illustrated on cooler 40 in FIG. 4, the raised structure 17 can comprise four separate posts $17_P$, with a post $17_P$ at each of four corners of the support 15. It can be relatively easy to evacuate a detector made with cooler 40, but cooling can be reduced due to a smaller surface area of contact of the raised structure 17.

As illustrated in FIG. 5, x-ray detector 50 can include a cap 55 carried by the support 15. The cap 55 can be electrically insulative, can have a top face $55_t$, and can have a bottom face $55_b$ opposite the top face $55_t$. The bottom face $55_b$ of the cap 55, the top face $55_t$ of the cap 55, or both, can be flat, planar surfaces. The bottom face $55_b$ of the cap 55 can be affixed to the raised structure 17 of the support 15, forming a cavity 57 between the cap 55 and the base 16 of the support 15 on the non-planar side $16_N$ of the support 15. The support 15 and underlying TEC 20 can be as described for cooler 10, 30, or 40. A silicon drift detector (SDD) can be affixed to the top face $55_t$ of the cap 55. The cap 55 can be affixed to the support 15 by epoxy. The SDD 56 can be affixed to the cap 55 by epoxy.

Also illustrated in FIG. 5, electronic component(s) 51 can be carried by the bottom face $55_b$ of the cap 55. The electronic component(s) 51 can extend into the cavity 57. The support 15 can be a single, solid, electrically insulative structure (i.e. the only solid, electrically insulative structure) between the upper electrical connections 23 in the top region of the TEC 20 and the electronic component(s) 51.

The bottom face $55_b$ of the cap 55 is illustrated in FIG. 6, showing the electronic components 51, traces 61 extending in a single plane along the bottom face $55_b$ of the cap 55 from the electronic components 51 to or near an outer perimeter of the cap 55, and wire bonds 62 electrically connecting the electronic components 51, traces 61, and the SDD 56 through holes extending through the cap 55. For example, the electronic component(s) 51 can include an amplifier, a transistor, a thermistor, a capacitor, or combinations thereof.

The support 15 can be free of electronic circuit traces. Thus, the function of the support 15 can be to electrically isolate the upper electrical connections 23 from the electronic components 51 and to provide the cavity 57 for containing the electronic components 51 and the wire bonds 62.

Second SDD Embodiment

As illustrated on x-ray detector 70 in FIG. 7, a TEC 20 as described above can be sandwiched between a pair of electrically insulating materials 11. A support 15 can be carried by the TEC 20. The support 15 can be directly affixed to one of the pair of electrically insulating materials 11.

The support 15 can include a base 16 with a planar side $16_P$. The planar side $16_P$ can face the TEC 20. The support 15 can include a non-planar side $16_N$ opposite of the planar side $16_P$. A raised structure 17 on the non-planar side $16_N$ can extend away from the base 16, as described above.

A cap 55, as described above, can be carried by the support 15. The cap 55 can be electrically insulative. The cap 55 can include a top face $55_t$ and a bottom face $55_b$ opposite the top face $55_t$. The bottom face $55_b$ of the cap 55, the top face $55_t$ of the cap 55, or both, can be flat, planar surfaces. The bottom face $55_b$ of the cap 55 can be affixed to the raised structure 17 of the support 15, forming a cavity 57 between the cap 55 and the base 16 of the support 15 on the non-planar side $16_N$ of the support 15. A silicon drift detector (SDD) can be affixed to the top face $55_t$ of the cap 55. Electronic component(s) 51 can be carried by the bottom face $55_b$ of the cap 55. The electronic component(s) 51 can extend into the cavity 57.

The support 15 can be metallic. One benefit of using a metallic support 15 is increased thermal conductivity, which can assist heat transfer away from the SDD 56. Another benefit is lower cost (metal can be formed easily into the shapes of the support 15 described above). Another benefit is that an electrically conductive metal can shield the SDD 56 and the electronic component(s) 51 from electromagnetic interference from the TEC 20. Another benefit is that a metallic support 15 can block fluoresced x-rays from the TEC 20 from interfering with the SDD 56.

It can be helpful for the support 15 to be made of low atomic number elements, to minimize interference in the SDD 56 by x-rays fluoresced from the support 15. Example materials for the support include aluminum, nickel, or both. For example, a material composition of the support 15 can be ≥20 mass percent, ≥50 mass percent, ≥75 mass percent, ≥90 mass percent, or ≥95 mass percent aluminum.

Nickel can be useful by blocking higher energy x-rays. X-rays fluoresced by nickel can also cause more interference with the SDD 56 than x-rays fluoresced by lower atomic number elements. The blocking ability of nickel can be achieved with reduced interference by embedding the nickel within or between lower atomic number material(s), such as aluminum. For example, a layer of aluminum can be deposited on each of two opposite faces of the nickel, or the nickel support 15 can be plated (electroplated or electroless) with aluminum or other low atomic number metal or metalloid.

Third SDD Embodiment

As illustrated on x-ray detector 80 in FIG. 8, a TEC 20 as described above can be sandwiched between electrically insulating materials 11 and 81. One of these electrically insulating materials, a plate 81, can have a top side $81_t$ and a bottom side $81_b$ opposite of the top side $81_t$. The top side $81_t$ and the bottom side $81_b$ of the plate 81 can be flat, planar surfaces.

The plate 81 can be a single, solid, electrically insulative structure extending across the upper electrical connections 23. The plate 81 can be free of adhesive-filled interface joints.

X-ray detector 80 can also comprise a support 15, like the support 15 described above. The non-planar side $16_N$ of the support 15 can face the top side $81_t$ of the plate 81. The raised structure 17 can extend towards the plate 81. The raised structure 17, such as a distal end $17_d$ farthest from the base 16, can be directly affixed (e.g. by epoxy) to the plate 81, forming a cavity 57 between the plate 81 and the base 16 of the support 15 on the non-planar side $16_N$ of the support 15. The planar side $16_P$ of the support 15 can be affixed (e.g. by epoxy) to the SDD 56.

Electronic component(s) 51 can be carried by the non-planar side $16_N$ of the support 15 and can extend into the cavity 57. The non-planar side $16_N$ of the support 15 is illustrated in FIG. 9, with traces 61, exposed to air, extending in a single plane along the non-planar side $16_N$ of the support 15 from the electronic component(s) 51, between the posts $17_P$ or through a gap in the rib $17_r$, to an outer perimeter of the support 15. There can be multiple traces 61. Each trace 61 can extend in a single plane along the non-planar side $16_N$ of the support 15 from an electronic component 51, between the posts $17_P$ or through a gap in the rib $17_r$, to an outer perimeter of the support 15. Each trace 61 can extend through a different gap in the rib $17_r$. The electronic components 51 and the wire bonds 62 can have other characteristics as described above.

The plate 81 can be a single, solid, electrically insulative structure (i.e. the only solid, electrically insulative structure) between the upper electrical connections 23 in the top region of the TEC 20 and the electronic component 51. The plate 81 and the support 15 can be free of adhesive-filled interface joints.

Pin Photodiode

As illustrated on x-ray detector 100 in FIG. 10, a TEC 20 as described above can be sandwiched between electrically insulating materials 11 and 81, for electrical isolation of the electrical connections 23 and 24. One of these electrically insulating materials, a plate 81, can have a top side $81_t$ and a bottom side $81_b$ opposite of the top side $81_t$. The top side $81_t$ and the bottom side $81_b$ of the plate 81 can be flat, planar surfaces.

The plate 81 can be a single, solid, electrically insulative structure extending across the upper electrical connections 23. The plate 81 can be free of adhesive-filled interface joints.

As illustrated in FIGS. 10-11, a PIN photodiode 106 can be directly affixed (e.g. by epoxy) to the top side $81_t$ of the plate 81. As illustrated in FIG. 10, trace(s) 61 can be directly affixed to the top side 81, of the plate 81. The plate 81 can be a single, solid, electrically insulative structure (i.e. the only solid, electrically insulative structure) between the upper electrical connections 23 in the top region of the TEC 20 and the PIN photodiode 106. In addition to the PIN photodiode 106, other electronic components 51 (e.g. an amplifier, a transistor, a thermistor, a capacitor, or combinations thereof), and traces 61 adjacent to the electronic components 51, can be affixed to the top side $81_t$ of the plate 81. The traces 61 can be exposed to air along their entire length. Wire bonds 62 can interconnect the PIN photodiode 106, the electronic components 51, the traces 61, and additional circuitry not shown.

All Embodiments

The various embodiments described herein can have reduced layers between the TEC 20 and the SDD 56 or the PIN photodiode 106. Although this can be beneficial for improved heat transfer between these components, it can also reduce x-ray shielding between these components. Thus, the various embodiments described herein can be particularly helpful for lead free detectors. In the various x-ray detector embodiments described herein, all solder bonds can be lead-free.

Bonding the components of the TEC 20 or other x-ray detector components can result in solder or adhesive at least partially covering bonding pads, such as bonding pads used for wire bonds to connect the electronic components 51 and traces 61 to external circuitry. As illustrated in FIGS. 3, 5, 8, and 9, a channel 35 at an outer perimeter of the support 15 or the plate 81 can be a reservoir for excess solder or adhesive. This channel 35 can fill with excess solder or adhesive instead of the solder or adhesive covering the bonding pads.

The channel 35 can be located in the raised structure 17 of the support 15. The raised structure 17 and the channel 35 can extend for an equivalent distance around the outer perimeter of the support 15.

The channel 35 can extend all or part of the way around the perimeter of the support 15 or the plate 81. For example, the channel 35 can extend ≥25%, ≥50%, ≥75%, or ≥95% and ≤100%, ≤90%, ≤80%, or s 60% around the outer perimeter of the support 15 or the plate 81.

Blocking Metal Layer

As illustrated in FIGS. 12-15, x-ray detectors 120, 130, 140, and 150 can comprise a blocking ceramic 121 sandwiched between an x-ray detection device 122 (e.g. PIN photodiode, silicon drift detector, etc.) and a cooling mechanism 123 (e.g. thermoelectric cooler). The blocking ceramic 121 can include a metal blocking layer 124 sandwiched between a pair of ceramic layers 125.

Electromagnetic interference from electronics in the cooling mechanism 123 can disrupt optimal operation of the x-ray detection device 122. The metal blocking layer 124 can be grounded to allow it to block this electromagnetic interference. As illustrated in FIG. 14, there can be a ground connection G to the metal blocking layer 124 in an opening in a perimeter of the metal blocking layer 124, between the pair of ceramic layers 125. Alternatively, as illustrated in FIG. 15, the metal blocking layer 124 can be encapsulated within the pair of ceramic layers 125, except for a hole 151 in the blocking ceramic 121 through which the ground connection G can pass to the metal blocking layer 124. The hole 151 can be located at a side of the blocking ceramic 121 on which the x-ray detection device 122 is located.

The metal blocking layer 124 can block electromagnetic interference arising out of the cooling mechanism 123 from interfering with the x-ray detection device 122. The metal blocking layer 124 can block fluoresced x-rays from the cooling mechanism 123, to prevent such x-rays from interfering with the x-ray detection device 122. Materials for the x-ray detection device 122 can be selected for optimal protection of the x-ray detection device 122. For example, the metal blocking layer 124 can include one or more of the following: nickel, aluminum, tantalum, molybdenum, titanium, tungsten, cobalt, titanium, chromium, a metal with an atomic number ≥13, a metal with an atomic number ≤79, or combinations thereof.

As illustrated in FIG. 13, the metal blocking layer 124 can include three layers, a layer C closest to the x-ray detection device 122, a middle layer M, and a layer F farthest from the x-ray detection device 122. For improved blocking of x-rays and to minimize stray x-ray interference with the x-ray detection device 122, the layer C closest to the x-ray detection device 122 can have a lowest atomic number of the three layers, the middle layer M can have an intermediate atomic number, and the layer F farthest from the x-ray detection device 122 can have a largest atomic number of the three layers. Although not shown in the figures, there can be two layers, four layers, or more than four layers. Cost can be weighed against increased efficiency due to more layers. Each of these layers can have a different material composition than the other layers.

The metal blocking layer 124 can be affixed to the pair of ceramic layers 125 by various methods, including solder or epoxy. Each added layer to the stack (e.g. solder or epoxy) can result in undesirable impurities or reduced cooling of the x-ray detection device 122 due to increased resistance to heat transfer at junctions. As illustrated in FIG. 15, one or both of the pair of ceramic layers 125 can include a cup or a cavity for holding metal blocking layer 124, which can avoid the use of the solder or epoxy.

The pair of ceramic layers 125 can adjoin or touch 141. The metal blocking layer 124 and the pair of ceramic layers 125 can be formed in a single blocking ceramic by co-firing, to bond the pair of ceramic layers 125 together at locations where they touch 141. The pair of ceramic layers 125 can adjoin each other at four outer corners as illustrated in FIG. 14. The pair of ceramic layers 125 adjoin each other 75%, but less than all, of a perimeter of the pair of ceramic layers 125. As shown in FIG. 15, the x-ray detector 150 can comprise one of or both of the pair of ceramic layers 125 including a cup facing the metal blocking layer 124, and the metal blocking layer 124 can be located in the cup. The pair of ceramic layers 125 can adjoin each other at an entire outer perimeter of each of the pair of ceramic layers 125 as illustrated in FIG. 15. Thus, co-firing the pair of ceramic layers 125 can capture the metal blocking layer 124 between the pair of ceramic layers 125 without added epoxy or solder layer.

There can be tight contact between the metal blocking layer 124 and the pair of ceramic layers 125 for improved heat transfer. Thus, the metal blocking layer 124 can include a top face $114_T$ adjoining one of the pair of ceramic layers 125 across all of the top face $114_T$ and a bottom face $114_B$ adjoining the other of the pair of ceramic layers 125 across all of the bottom face $114_B$.

What is claimed is:

1. An x-ray detector comprising:
   a thermoelectric cooler (TEC) comprising electrical components for thermoelectric cooling, including upper electrical connections in a top region, the upper electrical connections being electrically conductive;
   a plate and a PIN photodiode carried by the TEC with a sequence of the TEC, the plate, then the PIN photodiode;
   the plate having a top side; having a bottom side opposite of the top side, the bottom side directly affixed to the upper electrical connections of the TEC; being a single, solid, electrically insulative structure extending across the upper electrical connections; and having a trace directly affixed to the top side; and
   the PIN photodiode directly affixed to the top side of the plate.

2. The x-ray detector of claim 1, further comprising a channel at an outer perimeter of the plate.

3. The x-ray detector of claim 1, wherein the plate is directly affixed to the upper electrical connections by solder.

4. The x-ray detector of claim 1, wherein the plate is a single, solid, electrically insulative structure between the upper electrical connections of the TEC and the PIN photodiode.

5. The x-ray detector of claim 1, wherein the plate is free of adhesive-filled interface joints.

6. The x-ray detector of claim 1, further comprising:
   an electronic component, different from the PIN photodiode, directly affixed to the top side of the plate; and
   a portion of the trace adjacent to the electronic component.

7. The x-ray detector of claim 1, further comprising:
   a transistor and a thermistor directly affixed to the top side of the plate; and
   the transistor electrically coupled to the PIN photodiode.

8. The x-ray detector of claim 1, wherein the PIN photodiode is affixed to the plate by epoxy.

9. The x-ray detector of claim 1, wherein the bottom and top sides of the plate are flat, planar surfaces.

10. The x-ray detector of claim 1, wherein all solder bonds in the x-ray detector are lead-free.

11. A thermoelectric cooler (TEC), comprising:
    elements extending between a top region and a bottom region, the elements electrically coupled in series by upper electrical connections in the top region and by lower electrical connections in the bottom region, the upper electrical connections and the lower electrical connections being electrically conductive;
    a support including a base with a planar side, a non-planar side opposite of the planar side, and a raised structure on the non-planar side extending away from the base; and
    the planar side of the support directly affixed to the upper electrical connections, the support being a single, solid, electrically insulative structure extending across the upper electrical connections.

12. The TEC of claim 11, further comprising a channel at an outer perimeter of the support.

13. The TEC of claim 12, wherein the channel is in the raised structure and the channel extends for an equivalent distance around the outer perimeter of the support.

14. The TEC of claim 11, wherein:
    alternating elements are made of a different material with respect to each other; and
    alternating connections between adjacent elements are located alternately between the top region and the bottom region.

15. The TEC of claim 14, wherein the alternating elements made of a different material with respect to each other include alternating p-doped and n-doped semiconductors.

16. The TEC of claim 11, wherein the top region is a top plane and the bottom region is a bottom plane.

17. The TEC of claim 11, wherein the support is free of adhesive-filled interface joints.

18. A thermoelectric cooler (TEC), comprising:
    elements extending between a top region and a bottom region, the elements electrically coupled in series by upper electrical connections in the top region and by lower electrical connections in the bottom region, the upper electrical connections and the lower electrical connections being electrically conductive; and
    a plate having a top side; having a bottom side opposite of the top side, the bottom side directly affixed to the upper electrical connections; being a single, solid, electrically insulative structure extending across the upper electrical connections; and having a trace directly affixed to the top side.

19. The TEC of claim 18, further comprising a channel at an outer perimeter of the plate.

20. The TEC of claim 18, wherein:
    alternating elements are made of a different material with respect to each other, including alternating p-doped and n-doped semiconductors; and
    alternating connections between adjacent elements are located alternately between the top region and the bottom region.

* * * * *